United States Patent
Melz et al.

(10) Patent No.: US 9,441,592 B2
(45) Date of Patent: Sep. 13, 2016

(54) ACTIVATION UNIT WITH AN ACTUATOR

(75) Inventors: Tobias Melz, Darmstadt (DE); Thorsten Koch, Seeheim-Jugenheim (DE); Holger Hanselka, Darmstadt (DE)

(73) Assignee: FRAUNHOFER-GESELLSCHAFT ZUR FORDERLUNG DER ANGEWANDTEN FORSCHUNG E.V., Munich (DE)

( * ) Notice: Subject to any disclaimer, the term of this patent is extended or adjusted under 35 U.S.C. 154(b) by 842 days.

(21) Appl. No.: 13/695,832

(22) PCT Filed: May 4, 2011

(86) PCT No.: PCT/EP2011/002226
§ 371 (c)(1),
(2), (4) Date: Nov. 2, 2012

(87) PCT Pub. No.: WO2011/138026
PCT Pub. Date: Nov. 10, 2011

(65) Prior Publication Data
US 2013/0047839 A1   Feb. 28, 2013

(30) Foreign Application Priority Data
May 7, 2010   (DE) .......................... 10 2010 019 670

(51) Int. Cl.
| | |
|---|---|
| F01B 31/08 | (2006.01) |
| F02M 61/16 | (2006.01) |
| F15B 15/14 | (2006.01) |
| F02M 51/06 | (2006.01) |
| H01L 41/053 | (2006.01) |

(Continued)

(52) U.S. Cl.
CPC ....... *F02M 61/167* (2013.01); *F02M 51/0603* (2013.01); *F15B 15/1409* (2013.01); *H01L 41/053* (2013.01); *H01L 41/0536* (2013.01); *F02M 2700/077* (2013.01); *Y02T 10/166* (2013.01)

(58) Field of Classification Search
CPC ....................... F15B 15/1409; F02M 51/0603
See application file for complete search history.

(56) References Cited

U.S. PATENT DOCUMENTS 6,755,112 B2 *   6/2004   Burgdorf et al. ............ 91/369.2
(Continued)

FOREIGN PATENT DOCUMENTS

| DE | 39 16 539 C2 | 11/1990 |
|---|---|---|
| DE | 44 07 962 C1 | 6/1995 |

(Continued)

*Primary Examiner* — Michael Leslie
(74) *Attorney, Agent, or Firm* — Fitch, Even, Tabin & Flannery LLP

(57) ABSTRACT

An activation unit is disclosed having at least one actuator having a variable length disposed around at least one first axis. The activation unit operatively interacts with an activation element mounted so that it can be bi-directionally deflected along a second axis. The front side of the actuator is indirectly or directly engaged with a first piston, which can be deflected along the first axis in a mechanically positively driven manner. The first piston has a front side facing away from the actuator which axially borders at least regions of a transfer medium on one side. The transfer medium is radially surrounded relative to a first axis by a housing radially to the first axis, and axially borders at least regionally a front side of at least one second piston. The at least second piston can be deflected in a mechanically positively driven manner, and engages the activation element directly or indirectly. An actively variable and/or passive temperature control medium is provided on and/or in the housing that is in indirect or direct thermal contact with the transfer medium.

24 Claims, 4 Drawing Sheets

(56) References Cited

U.S. PATENT DOCUMENTS

Figure 1:
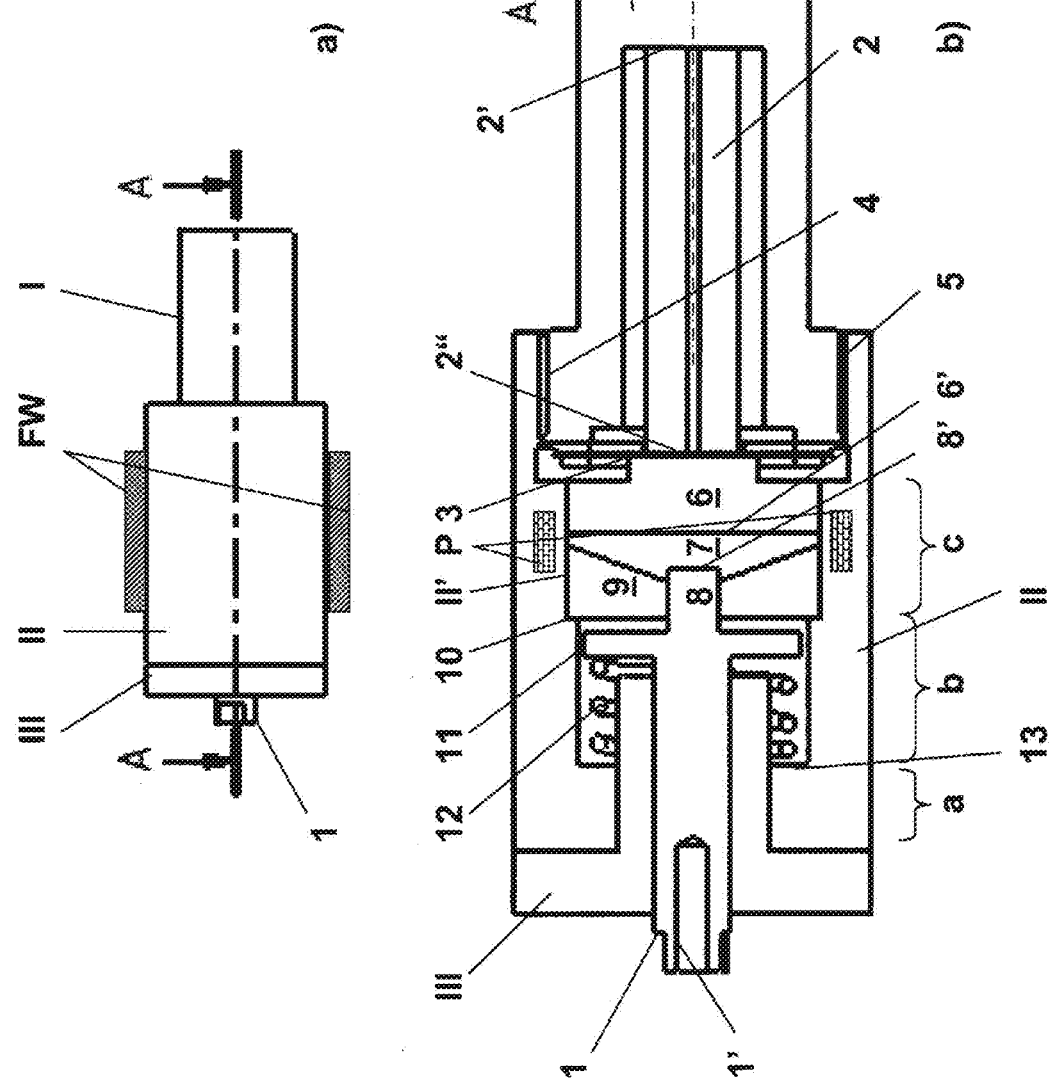

| | | |
|---|---|---|
| 6,932,278 B2 | 8/2005 | Reiter et al. |
| 7,669,783 B2 * | 3/2010 | Fischer et al. .................. 251/57 |
| 2003/0127615 A1 | 7/2003 | Fischer et al. |

FOREIGN PATENT DOCUMENTS

| | | |
|---|---|---|
| DE | 197 05 893 A1 | 8/1998 |
| DE | 102 03 659 A1 | 7/2003 |
| DE | 10 2006 031 373 A1 | 1/2008 |

* cited by examiner

ACTIVATION UNIT WITH AN ACTUATOR

CROSS-REFERENCE TO RELATED APPLICATION

Reference is made to German Patent Application DE 10 2010 019 670.3, filed May 7, 2010 and PCT Patent Application PCT/EP2011/002226, filed May 4, 2011, which applications are incorporated herein by reference in its entirety.

BACKGROUND OF THE INVENTION

1. Field of the Invention

The invention relates to an activation unit with at least one actuator having a variable length around at least one first axis, which operatively interacts directly or indirectly with an activation element mounted to be bi-directionally deflected along a second axis.

2. Description of the Prior Art

Activation units of the aforementioned kind are known in a wide variety of technical applications for path and/or pressure transfer in the form of stroke or force transmitting elements. Reference is made in this regard to DE 39 16 539 C2, describing an activation unit with two piezoceramic actuators, which are spaced apart relative to each other along a shared first axis, and are each subjected to a lengthwise expansion directed toward each when electrically activated. Each individual actuator activates a cylinder plunger, which becomes engaged with a pressure transfer medium disposed along the first axis symmetrically between both actuator cylinder plunger pairs. The cylinder plungers, which act bilaterally on the medium, cause an elastomeric material functioning as the pressure transfer medium to experience a bi-directionally guided compression along the first axis, as well as an elastic expansion along a second axis oriented orthogonally to the first axis. Along the second axis, the elastomeric pressure transfer medium comes into contact with an activation element which is a spacer bolt which is linearly deflected to trigger a technical function. Such an activation unit makes it possible to largely decouple mechanical oscillations between the activation element and piezoceramic actuators caused by the interconnected elastomeric pressure transfer medium such as for example those encountered in combustion engines. First and foremost, however, the pressure transfer medium as well as the cylinder plunger surfaces bordering the pressure transfer medium are used relative to the surface of the spacer bolt bordering the pressure transfer medium for purposes of an adjustment path and adjustment force transfer with respect to the actuator length changes initiated by the solid-state actuators. In order to increase the adjustment path and adjustment force, the selected bolt surface must be smaller than the cylindrical plunger surfaces.

Described in DE 197 05 893 A1 is a modular actuating and control unit for use in various hydraulic and pneumatic valves, which is powered by at least one solid-state actuator preferably designed as a stacking actuator, whose first actuator end is fixedly supported against a mechanical counter bearing, and whose freely movable second actuator end is joined with a first piston that unilaterally borders a hollow space inside a housing. The housing contains a transfer medium in the form of an incompressible liquid, such as water or hydraulic oil. Opposite the first piston in an axial direction of action, a second axially movable stamp unilaterally seals the hollow space impermeably to fluids, and when correspondingly activating the actuator, it is axially deflected by the transfer medium that transfers the force to an extent proportional to the area ratios of both piston surfaces directly bordering the transfer medium.

DE 102 03 659 A1 discloses a fuel injection valve having an adjustment path mechanism comparable to the actuating and control unit described above, with a stacking actuator connected with a first piston, which is in turn operatively connected with an encapsulated rheological liquid as the transfer medium. Likewise, a second axially deflectable piston borders the encapsulated rheological liquid, wherein the piston surfaces of both pistons which are operatively connected by way of the transfer medium, differ from each other making it possible to realize an adjustment path or adjustment force transfer from one to the other piston.

Instead of a rheological liquid as the transfer medium, the actuating or drive element described in DE 44 07 962 C1 provides an elastomer body as the transfer medium that is also bilaterally bordered by a first and second adjustment path piston, having a first piston is operatively connected with a solid-state stacking actuator and a second piston serving as a drive element for the actuator.

The known piezoelectrically powered activation elements for adjustment path and force transfer are used for a plurality of different applications, but preferably in adjustment valve systems used for control purposes in fluidics or pneumatics. However, as the time usage for which these types of activation elements increases, the properties of the activation units change with regard to the magnitude and dynamics of the achievable adjustment paths and adjustment forces alike. This phenomenon is typically not desired. Such changing properties may stem from different causes, which have to be examined so that adequate countermeasures can ultimately be taken, or operationally induced changes in the properties of such activation elements can be advantageously implemented in a technically usable manner depending on their operationally induced causes.

SUMMARY OF THE INVENTION

The invention is an activation unit with at least one actuator having a variable length around at least one axis, which operatively interacts with an activation element mounted so that it can be bi-directionally deflected along a second axis, so that measures can be taken to compensate for operationally induced changes in the characteristics of the activation element in terms of adjustment path and adjustment force magnitude, or at least control of the adjustment force magnitude is made to make operationally-induced changes in properties of the activation element useable in a technically advantageous manner.

It was discovered from comprehensive studies of continuously operating generic activation units that, in addition to negligible signs of wear on individual components, in particular those arising between the movable and immovable components of the activation unit, frictional heating leads to macroscopically measurable changes, at least relative to the adjustment path achievable by the activation element.

The invention is based on exerting an influence, preferably a controlled influence, on the operating temperature of the activation unit, and doing so with the simplest possible structural means, which do not impair the adjustment path transfer principle governing the activation unit. With the invention, an activation unit is further developed by providing an actively variable and/or passive temperature control medium on and/or in the housing that is in indirect or direct thermal contact with the transfer medium.

The examinations described above revealed that the transfer medium, which most often has at least one elastomeric material, but can also be an incompressible liquid, is subject to a significant level of heating as the result of friction caused by the relative movement of the axially positively driven stamps inside the housing and its effect on the transfer medium.

While the friction induced heat generation could most assuredly be reduced by selecting the suitable structural design and materials for the components of the activation unit that can move relative to each other, these measures involve in part very complex modifications of generic activation units that are associated with high costs. In a simplest embodiment, the approach according to the invention proceeds from the fact that, in the event of operationally induced, undesired heating, excess heat is removed from the transfer medium being heated by implementing suitable cooling measures. The cooling or heat removal process can basically be realized in a controlled manner using adjustable temperature control media or cooling precautions, such as by providing a coolant line in thermal contact with the housing of the activation unit, through which a coolant can be controllably conveyed, or by providing at least one thermoelectric structural element in the area of the housing, for example which can be configured as a Peltier unit for purposes of targeted cooling.

By contrast, however, it also makes sense to alternatively realize suitable temperature control measures that involve cooling in purely a passive manner, for example, by providing correspondingly designed heat shunt ribs on the outside of the housing, which enable an improved heat dissipation.

Additional cooling measures of this kind are described in conjunction with the exemplary embodiments depicted in the drawings. However, it should be noted at this juncture that the operationally induced changes in the adjustment path and adjustment force transfer of corresponding activation units can also be used in a technically beneficial manner. For example, the adjustment paths, adjustment force and dynamics of activation unit operation can all be influenced by correspondingly controlling the temperature of the activation unit. This influence ultimately makes it possible to provide the activation unit with a suitable temperature control unit with which a correspondingly desired temperature level for the activation unit can be specifically set. For example, in addition to means for reducing a current operating temperature, that is, providing one or several Peltier units, corresponding thermoelectric heating elements could also be attached to or integrated into the activation unit housing, which provide for a specifically prescribed temperature level inside the activation unit by way of a corresponding control unit.

Additional features relating to the inventive will be explained in conjunction with the specific exemplary embodiments illustrated below.

BRIEF DESCRIPTION OF THE INVENTION

The invention will be exemplarily described below without limiting the overall idea of the invention based on an exemplary embodiment, making reference to the drawings.

FIGS. 1a and b are a side view and longitudinal section of an activation unit designed according to the invention; and FIGS. 2-5 are exemplary embodiments of alternative temperature control for controlling the temperature of the transfer medium

DETAILED DESCRIPTION OF THE INVENTION

FIG. 1a is a schematic side view of an activation unit designed according to the invention with a schematic longitudinal section being shown in FIG. 1b. The additional embodiments are illustrated with identical reference numbers being used for the same components as in FIGS. 1 and 1b.

The exemplary embodiment illustrated in FIGS. 1a and b for n activation unit exhibits a compact appearance outwardly shaped by two cylindrical housing sections I and II that are joined together and exhibit different dimensions in terms of diameter. Both housing sections I and II are arranged along a shared cylindrical axis, hereinafter referred to as the first axis A. Secured to the end of the cylindrical housing section II is a cover plate III. The activation element 1 of the activation unit is bi-directionally deflectable along the first axis A by application of force. To explain how the adjustment path of the activation element 1 is deflected along the first axis A through application of a force, reference is made to the individual components of the activation unit which are visible in the longitudinal section according to FIG. 1b. However, it should be noted that heat dissipating surface elements FW, in the form of cooling ribs, are attached to the outside of housing section II in one possible embodiment, to cause heat to be released to the environment. In order to support the release of heat to the environment, a controlled stream of medium, for example, a stream of air or fluid, can additionally be made to flow around the cooling ribs FW, by a ventilator or fluid pump.

A solid-state actuator 2, having an oblong shape along the first axis A, is provided inside the first housing section I, which is shaped like a pot in longitudinal section, is hereinafter referred to as a housing. The solid-state actuator 2 is supported by one of its two front sides 2' against the interior floor of the housing I, and ends mounted freely on its other front side 2", i.e., largely without any mechanical constraint acting on the front side 2". The solid-state actuator 2 is centered inside the housing I with a separating plate 3 arranged inside a corresponding recess in the housing so that it can move linearly relative to the first axis A, to which the solid-state actuator 2 is loosely secured on its front side. However, as an alternative to using a solid-state actuator, which preferably corresponds to a piezoceramic stacking actuator, but can also be electrostrictive, magnetostrictive, or have a similar basis, use can also be made of other, classic actuator types, whose actuator properties involve initiating a linear expansion or linear deflection. Actuators based on a hydraulic, pneumatic and/or mechanical operating principle are essentially also suitable, for example in the form of a cylinder-plunger unit. Also possible is the use of an actuator based on an electrodynamic linear drive. In the following, the use of a solid-state actuator is assumed with the objective being to deflect the actuator over a larger adjustment path by means of the transfer medium and stamps operatively connected thereto. Conversely, it is also just as conceivable to use a corresponding reduction mechanism to diminish the adjustment paths, for example when using actuator types that originally have large adjustment paths.

In the exemplary embodiment as shown, the housing I exhibits a male thread 4 facing the housing section II, hereinafter referred to as casing, which can be engaged with a female thread provided on the casing II, to establish a detachably fixed joint between the housing I and casing II.

The casing II essentially has three hollow cylindrical sections a, b, c provided with different inside diameters, which integrate the following components.

Inside the hollow cylindrical section c of casing II, the first stamp 6 is positively driven in an axially movable manner through the inner casing wall linearly relative to the first axis A, and operatively interacts axially with the solid-state actuator 2 via the separating plate 3 having a front side facing the solid-state actuator 2. The first stamp 6 further has a front surface 6' facing away from the solid-state actuator 2 and axially abutting by the transfer medium 7, which is radially bordered by the casing wall II". Provided axially opposite the first stamp 6 is a second, axially movable stamp 8, which is separated from the first stamp 6 by the transfer medium 7. Since the surface area of the front surface 8' of the second stamp 8 is illustrated with smaller dimensions than those of the front surface 6' of the first stamp 6, a limiting element 9 is provided, which axially abuts against a mechanical counter-stop 10 inside the hollow cylinder section c. The limiting element 9 stationarily borders the casing wall II' of the transfer medium 7. Depending on the size which is selected for the second stamp 8, the limiting element 9 must be configured accordingly, so that the limiting element 9 along with the front surface 8' of the second stamp 8 axially borders the transfer medium 7 completely.

The second stamp 8 borders the transfer medium 7 on the front side. The illustrated exemplary embodiment is joined as a single piece with the activation element 1. The front side of the activation element exhibits a female thread 1' for connection with an external unit. Of course, it is possible to make the stamp 8 detachable relative to the activation element 1, so that it can be changed out separately from the activation element according to the module principle.

The stamp 8 further has a radially expanded collar section 11, against which a spring element 12 presses on one side, while on the other hand is supported against a counter-contour 13 on the casing II so as to generate a preliminary tension oriented against the lengthwise expansion of the solid-state actuator 2 along the first axis A. The elastic force generated by the spring element 12 assists in the initial positioning of the solid-state actuator 2, which can established as distinctly more of a delay, as opposed to the lengthwise expansion. In addition, the elastic force emanating from the spring element 12 ensures an intimate axial contact between the individual components 6, 7 and 8, as well as between the solid-state actuator 2 and separating plate 3.

Finally, the hollow cylindrical section a has extending through it a cover element III extending through it, which is typically secured to the casing II in a detachably fixed manner by bolted connections. Inside the cover element III, the activation element 1 is linearly guided in motion along a first axis A.

As they move during operation, stamps 6 and 8 in part execute high frequency linear motions along the axis A, and at least their edge sections come into frictional contact with both the inner casing wall II' and the transfer medium 7. The stamp 8 facing the transfer medium 7 is additionally enveloped by the limiting element 9 and has intimate frictional contact with the limiting element 9. Along with the shear strains arising in the elastomer, all frictional surfaces between the linearly movable stamps 6 and 8 and the stationary components can incrementally contribute to a heating of all components and in particular the transfer medium 7. The transfer medium 7 when heated provides variable elastic properties for the transfer medium 7 most often being an elastomer. The surface elements FW attached to the outside of the casing section II release heat into the environment and are one of the means used to counteract the frictional heating.

As an alternative to or in combination with the surface elements FW, thermoelectric structural elements can be placed in the area of the casing wall II, that is, in the form of Peltier units P, as illustrated in the longitudinal section depicted on Fig. b. Peltier units are actively actuatable cooling elements that are able to controllably remove heat. A power and actuating unit required for actuating the Peltier units P, which must be provided separately from the activation unit, or can likewise be integrated into the casing, just as the Peltier units P are not illustrated.

Figure 2:
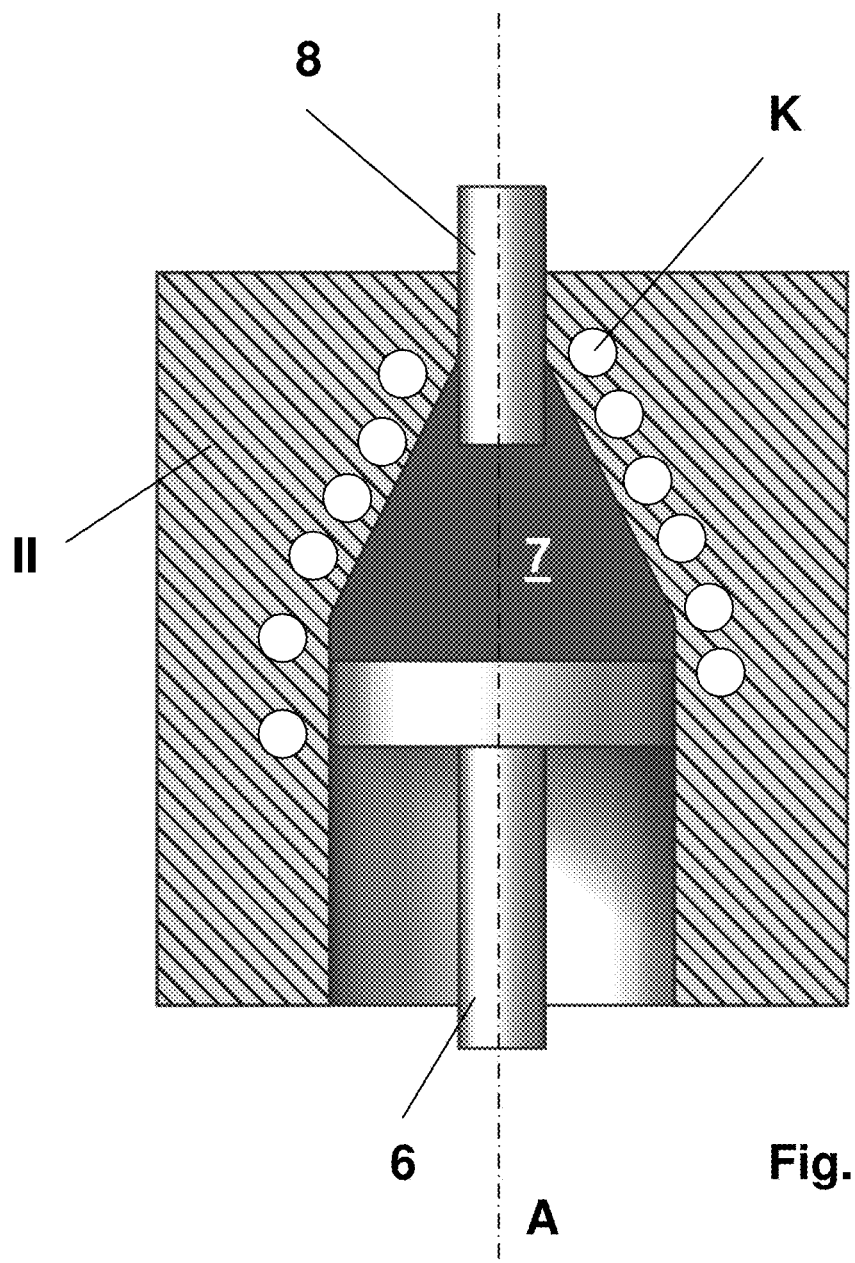
Figure 3:
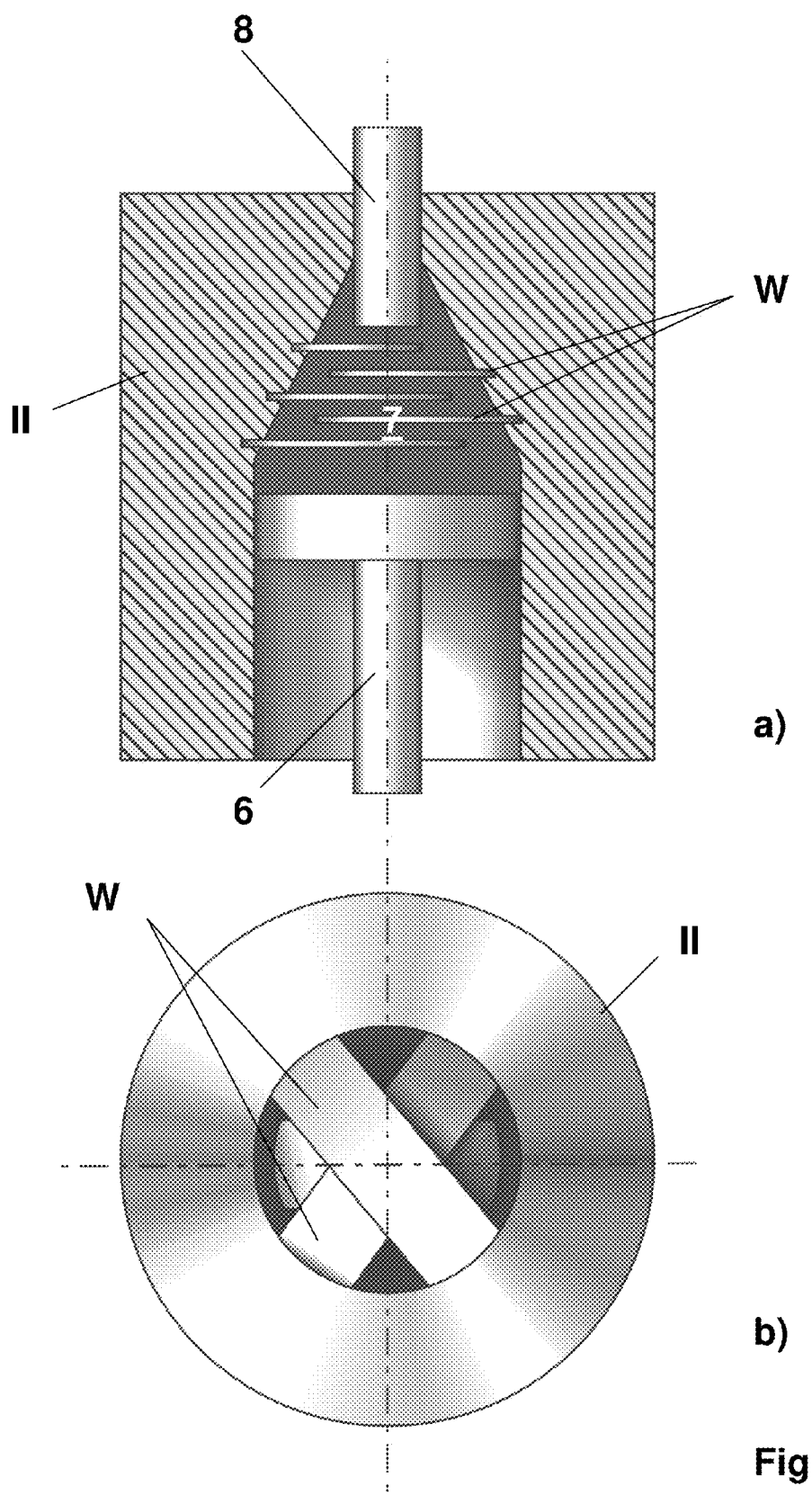

FIG. 2 illustrates another way to cool the transfer medium 7. In the interest of providing a simplified depiction of the activation unit, an illustration is only provided of the casing section II, inside of which both the stamp 6 and stamp 8 are guided along the axis A in a bi-directional manner. Both stamps 6 and 8 operatively interact axially with the transfer medium 7 inside the casing section II that otherwise radially envelops it. In order to specifically remove heat from the transfer medium 7 owing to operationally induced heating, the exemplary embodiment illustrated on FIG. 2 provides a cooling channel K spirally enveloping the area of the transfer medium inside the casing section II, through which a temperature control medium, preferably cooling water, can be passed. How the coolant is supplied and removed via the cooling channel K is not illustrated in any greater detail.

Of course, the temperature of the casing section II, and by extension the transfer medium 7, can be specifically controlled by controlling the temperature of the cooling medium guided through the cooling channel K itself by a suitable externally provided temperature control unit to keep the transfer medium at a constant desired temperature.

The exemplary embodiment illustrated on FIGS. 3a and b represents an activation unit with heat exchange bodies W, which are each connected at least on one side with the casing wall of the casing section II, and project into the interior of the transfer medium 7. FIG. 3a depicts a longitudinal section and FIG. 3b depicts a cross section through the area of casing section II. As a consequence, the heat exchange bodies W constitute heat conducting bridges leading directly from the volume of the transfer medium 7 into the casing wall section II enveloping the transfer medium 7. Of course, the cooling ribs illustrated on FIG. 1 can additionally be attached to the outside of the casing to improve the release of heat into the environment by the casing section II.

The heat exchange bodies W advantageously are a thermally readily conductive material, preferably of metal, and resemble webs. As an alternative, comparable heat exchange bodies can be designed as pins, plates or grids, and secured inside the area of the transfer medium 7 in the described from according to FIG. 3.

Figure 4:
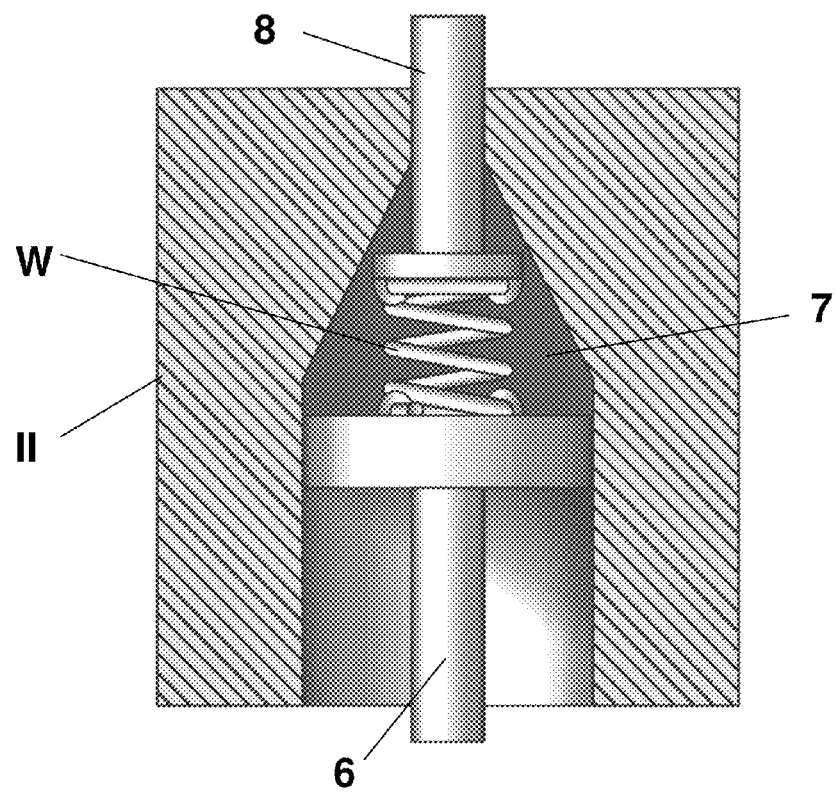

FIG. 4 illustrates another exemplary embodiment that provides a heat exchange body W placed inside the transfer medium 7 for specifically removing heat from the transfer medium 7. The heat exchange body W illustrated on FIG. 4 connects the pistons 6 and 8 on the respective front side, which preferably themselves are a readily thermally conductive material, for example, metal. The heat exchange body W, which is preferably also metal, is shaped like a spiral spring, and in addition to effectively removing heat from the transfer medium 7, is able to mutually brace the two pistons 6 and 8 positively driven in a linear manner along the axis A. This combines thermotechnically relevant aspects for targeted heat dissipation with mechanical aspects, which impart a predefinable adjustment path and adjustment force characteristic along with a defined dynamic actuator behavior to the activation unit.

Of course, heat exchange bodies W that transmit heat exclusively can also be accommodated between the pistons 6 and 8, which otherwise permit no transfer of force whatsoever between the two stamps.

Figure 5:
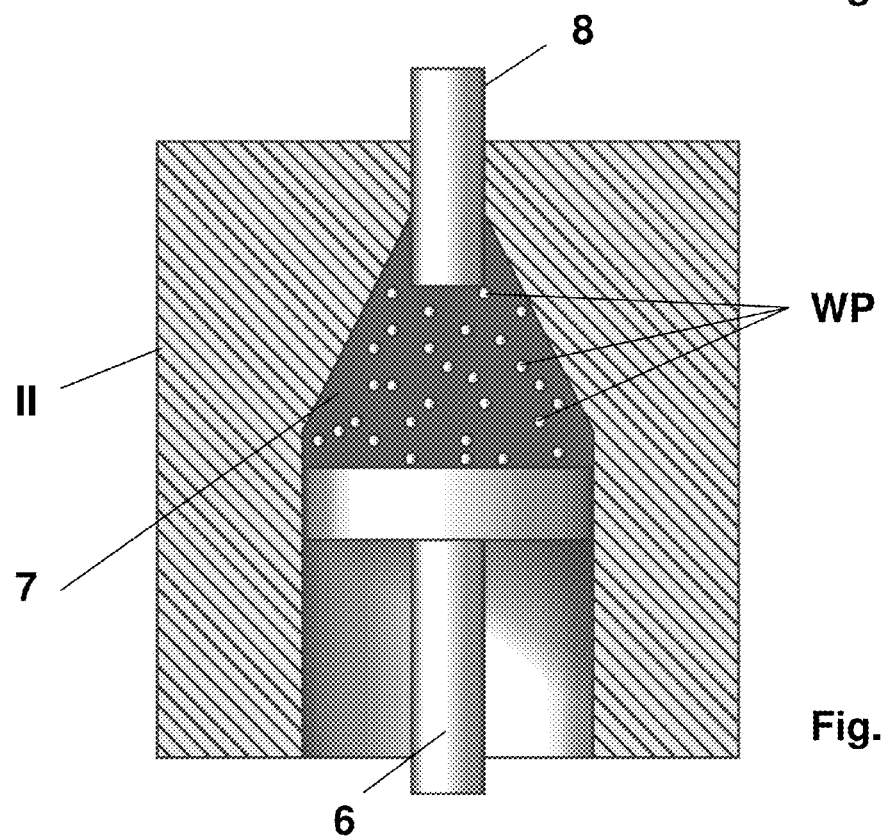

In the exemplary embodiment illustrated on FIG. 5, thermally conductive particles WP are suspended within the transfer medium 7 to improve the release of heat from the transfer medium 7 to the casing wall area II. For example, such particles can represent metal powders or metal globules, which are used to improve heat exchange between the transfer medium 7 and casing II.

REFERENCE LIST

I, II and III Housing sections
1 Activation element
2 Actuator, preferably solid-state actuator
2' and 2" Front sides of the actuator
3 Separating plate
4 Male thread
5 Female thread
6 First stamp
6' Front surface
7 Transfer medium
8 Second stamp
8' Front surface
9 Limiting element
10 Mechanical stop
11 Radial projection
12 Spring element
13 Mechanical stop
III Cover element
a, b and c Hollow cylinder sections
A First axis
B Second axis
C Third axis
FW Surfaces elements, cooling ribs
K Cooling channel
W Heat exchange body
P Peltier unit
WP Thermally conductive particles

The invention claimed is:

1. An activation unit having at least one actuator of a variable length disposed around at least one first axis and which operatively interacts with an activation element which is bi-directionally movable along a second axis, comprising:
   an actuator which is indirectly or directly engaged with a first piston which is movable along the first axis by a positive drive;
   the first piston includes a front side facing away from the actuator and axially bordering one side of a transfer medium comprising at least one elastomeric material;
   the transfer medium being surrounded radially by a housing relative to the first axis, bordering at least regionally another side of the transfer medium along the first axis and a front side of at least one second piston and the at least second piston being movable by a positive drive and engaging the activation element directly or indirectly; and
   an active variable and/or passive temperature control on and/or in the housing that is in indirect or direct thermal contact with the transfer medium for providing temperature control of the transfer medium; and wherein the temperature control is one of a fluid line which is in thermal contact with the housing and through which a temperature control medium can be conveyed, at least one thermoelectric structural component, a Peltier element and a heating element.

2. The activation unit according to claim 1, wherein:
the temperature control comprises at least one heat conducting rib attached to an outside of the housing.

3. The activation unit according to claim 2, comprising:
a heating or cooling unit providing a selectable quantity of a heating or cooling agent into thermal contact with the at least one heat conducting rib.

4. The activation unit according to claim 1, wherein:
the temperature control comprises at least one heat exchange body in direct thermal contact with the housing and the transfer medium.

5. The activation unit according to claim 4, wherein:
the at least one heat exchange body comprises a pin, web, plate or grid, connected on at least one side of an interior wall with the housing and/or with at least one piston, and projects at least partially into the transfer medium and is surrounded by the housing disposed radially from the first axis.

6. The activation unit according to claim 4, wherein:
the at least one heat exchange body is connected with the first and second piston and provides heat conduction between the pistons.

7. The activation unit according to claim 6, wherein:
the at least one heat exchange body comprises at least one tension-storing element for positioning the pistons mechanically axially relative to each other.

8. The activation unit according to claim 1, comprising:
particles providing thermal conductivity mixed with the transfer medium to provide exchange of heat between the transfer medium and housing.

9. The activation unit according to claim 2, comprising:
particles providing thermal conductivity mixed with the transfer medium to provide exchange of heat between the transfer medium and housing.

10. The activation unit according to claim 3, comprising:
particles providing thermal conductivity mixed with the transfer medium to provide exchange of heat between the transfer medium and housing.

11. The activation unit according to claim 4, comprising:
particles providing thermal conductivity mixed with the transfer medium to provide exchange of heat between the transfer medium and housing.

12. The activation unit according to claim 5, comprising:
particles providing thermal conductivity mixed with the transfer medium to provide exchange of heat between the transfer medium and housing.

13. The activation unit according to claim 6, comprising:
particles providing thermal conductivity mixed with the transfer medium to provide exchange of heat between the transfer medium and housing.

14. The activation unit according to claim 7, comprising:
particles providing thermal conductivity mixed with the transfer medium to provide exchange of heat between the transfer medium and housing.

15. The activation unit according to claim 1, wherein:
the first and second axes spatially coincide and are coaxial.

16. The activation unit according to claim 2, wherein:
the first and second axes spatially coincide and are coaxial.

17. The activation unit according to claim 3, wherein:
the first and second axes spatially coincide and are coaxial.

18. The activation unit according to claim 4, wherein:
the first and second axes spatially coincide and are coaxial.

19. The activation unit according to claim 5, wherein:
the first and second axes spatially coincide and are coaxial.

20. The activation unit according to claim 6, wherein:
the first and second axes spatially coincide and are coaxial.

21. The activation unit according to claim 7, wherein:
the first and second axes spatially coincide and are coaxial.

22. The activation unit according to claim 8, wherein:
the first and second axes spatially coincide and are coaxial.

23. The activation unit according to claim 1, wherein:
the actuator is a solid-state hydraulic, pneumatic, electrodynamic and/or mechanical actuator.

24. The activation unit according to claim 23, wherein the actuator comprises:
a linear drive unit.

* * * * *